(12) United States Patent
Wann et al.

(10) Patent No.: US 9,349,659 B2
(45) Date of Patent: May 24, 2016

(54) METHODS FOR PROBING SEMICONDUCTOR FINS AND DETERMINING CARRIER CONCENTRATIONS THEREIN

(71) Applicant: Taiwan Semiconductor Manufacturing Company, Ltd., Hsin-Chu (TW)

(72) Inventors: Clement Hsingjen Wann, Carmel, NY (US); Yasutoshi Okuno, Hsin-Chu (TW); Ling-Yen Yeh, Hsin-Chu (TW); Chi-Yuan Shih, Hsin-Chu (TW); Yuan-Fu Shao, Taipei (TW); Wei-Chun Tsai, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/742,439

(22) Filed: Jun. 17, 2015

(65) Prior Publication Data

US 2015/0287652 A1     Oct. 8, 2015

Related U.S. Application Data

(62) Division of application No. 13/689,262, filed on Nov. 29, 2012, now Pat. No. 9,093,335.

(51) Int. Cl.
*H01L 21/66*     (2006.01)
*H01L 21/306*    (2006.01)
*H01L 29/06*     (2006.01)
(Continued)

(52) U.S. Cl.
CPC .......... *H01L 22/14* (2013.01); *H01L 21/30625* (2013.01); *H01L 29/0642* (2013.01); *H01L 29/161* (2013.01); *H01L 29/66795* (2013.01); *H01L 22/34* (2013.01)

(58) Field of Classification Search
CPC .............. H01L 22/14; H01L 21/30625; H01L 29/0642; H01L 29/161; H01L 29/66795; H01L 22/34
USPC .................................................... 438/17
See application file for complete search history.

(56) References Cited

U.S. PATENT DOCUMENTS 7,151,018 B1 * 12/2006 Nunan et al. ................... 438/176
8,004,045 B2     8/2011 Sasaki et al.
8,063,437 B2    11/2011 Sasaki et al.
(Continued)

FOREIGN PATENT DOCUMENTS

CN    101542743    9/2009
TW    I335642      4/2005

OTHER PUBLICATIONS

R. V. Joshi, 3-D Thermal Modeling of FinFET, IBM, T. J. Watson Research Center, Yorktown Heights, NY-10598, Proceedings of ESSDERC, Grenoble, France, 2005.*

(Continued)

*Primary Examiner* — Caleb Henry
(74) *Attorney, Agent, or Firm* — Slater Matsil, LLP

(57) ABSTRACT

A method includes probing at least one semiconductor fin using a four-point probe head, with four probe pins of the four-point probe head contacting the at least one semiconductor fin. A resistance of the at least one semiconductor fin is calculated. A carrier concentration of the semiconductor fin is calculated from the resistance.

20 Claims, 7 Drawing Sheets

(51) Int. Cl.
*H01L 29/161* (2006.01)
*H01L 29/66* (2006.01)

(56) References Cited

U.S. PATENT DOCUMENTS

| | | | |
|---|---|---|---|
| 8,409,939 B2 | 4/2013 | Sasaki et al. | |
| 8,536,000 B2 | 9/2013 | Sasaki et al. | |
| 8,574,972 B2 | 11/2013 | Sasaki et al. | |
| 2007/0176124 A1 | 8/2007 | Sasaki et al. | |
| 2008/0277745 A1* | 11/2008 | Hsu et al. | 257/412 |
| 2009/0026540 A1* | 1/2009 | Sasaki et al. | 257/344 |
| 2009/0042321 A1 | 2/2009 | Sasaki et al. | |
| 2009/0238010 A1 | 9/2009 | Juengling | |
| 2009/0283244 A1 | 11/2009 | Bezama et al. | |
| 2009/0289300 A1* | 11/2009 | Sasaki et al. | 257/344 |
| 2009/0294842 A1 | 12/2009 | Juengling | |
| 2010/0028809 A1 | 2/2010 | Vanleenhove et al. | |
| 2010/0052043 A1 | 3/2010 | Lee | |
| 2010/0066440 A1 | 3/2010 | Juengling | |
| 2010/0203734 A1 | 8/2010 | Shieh et al. | |
| 2011/0065266 A1* | 3/2011 | Sasaki et al. | 438/513 |
| 2011/0147813 A1* | 6/2011 | Sasaki et al. | 257/288 |
| 2011/0275201 A1 | 11/2011 | Sasaki et al. | |
| 2012/0015504 A1 | 1/2012 | Sasaki et al. | |
| 2012/0034750 A1 | 2/2012 | Sasaki et al. | |
| 2012/0126883 A1* | 5/2012 | Juengling | 327/581 |
| 2013/0115768 A1 | 5/2013 | Pore et al. | |
| 2013/0175586 A1 | 7/2013 | Sasaki et al. | |
| 2013/0292805 A1* | 11/2013 | Cai et al. | 257/622 |

OTHER PUBLICATIONS

Vandervorst, W. et al., "Probing doping conformality in fin shaped field effect transistor structures using resistors", AIP Scitation, JVSTB, J. Vac. Sci. Technol., vol. B, No. 26, 2008, p. 1-7.

* cited by examiner

METHODS FOR PROBING SEMICONDUCTOR FINS AND DETERMINING CARRIER CONCENTRATIONS THEREIN

PRIORITY CLAIM AND CROSS-REFERENCE

This application is a divisional of U.S. patent application Ser. No. 13/689,262, entitled "Calculating Carrier Concentrations in Semiconductor Fins Using Probed Resistance," filed on Nov. 29, 2012, which application is incorporated herein by reference.

BACKGROUND

With the increasing down-scaling of integrated circuits and increasingly demanding requirements to the speed of integrated circuits, transistors need to have higher drive currents with smaller dimensions. Fin Field-Effect Transistors (FinFETs) were thus developed. FinFETs have increased channel widths. The increase in the channel widths is achieved by forming channels that include portions on the sidewalls of semiconductor fins and portions on the top surfaces of the semiconductor fins. Since the drive currents of transistors are proportional to the channel widths, the drive currents of the FinFETs are increased.

In an existing FinFET formation process, Shallow Trench Isolation (STI) regions are first formed in a silicon substrate. The STI regions are then recessed to form silicon fins, which comprise portions of the silicon substrate that are over the recessed STI regions. Next, a gate dielectric, a gate electrode, and source and drain regions are formed to finish the formation of the FinFET.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method of measuring the carrier concentration of semiconductor fins is provided in accordance with various exemplary embodiments. The variations and the operation of the embodiments are discussed. Throughout the various views and illustrative embodiments, like reference numbers are used to designate like elements.

Figure 1A:
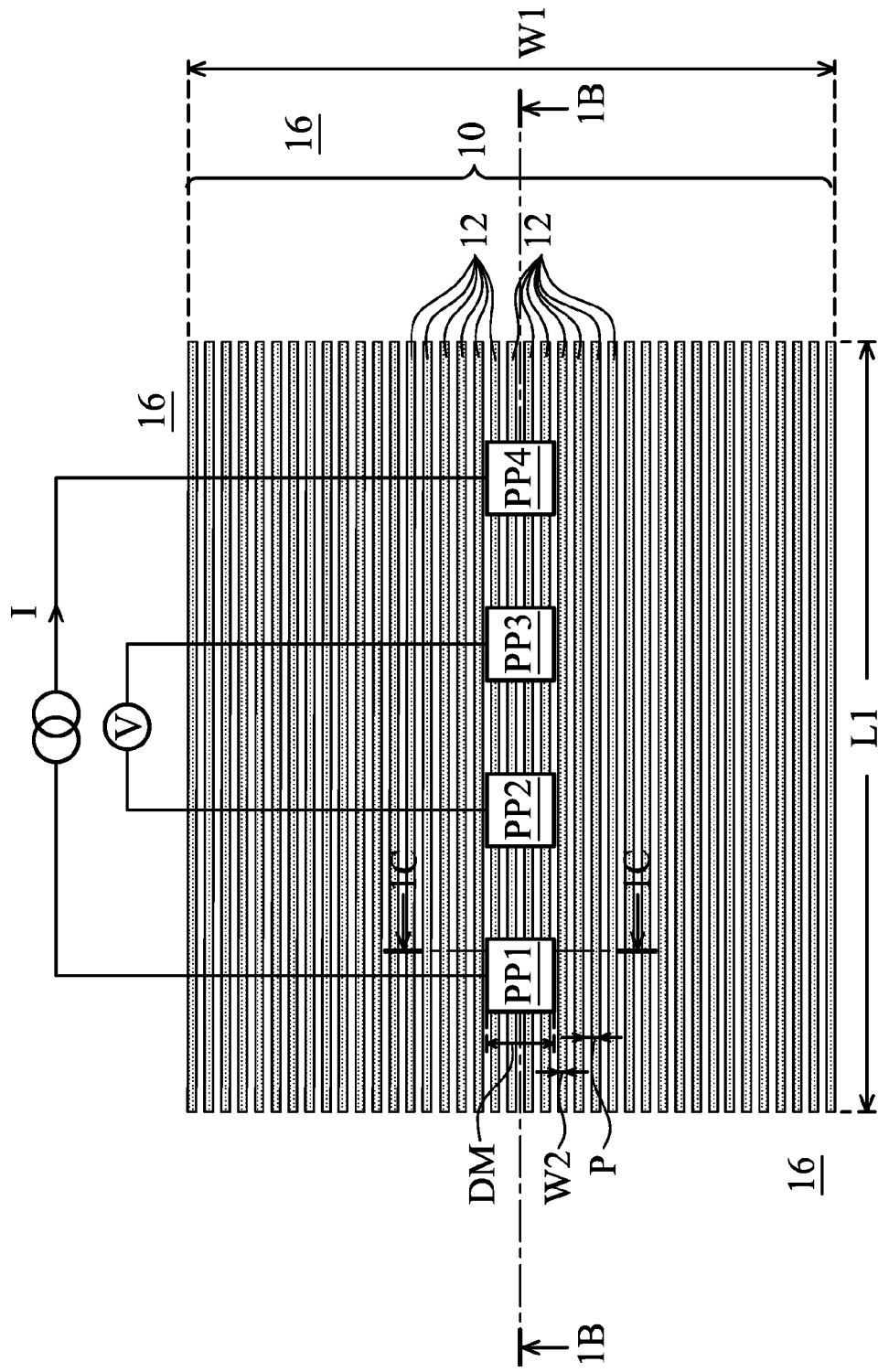
FIGS. 1A and 1B illustrate a top view and a cross-sectional view, respectively, of a plurality of semiconductor fins, and a four-point probe performed on the plurality of semiconductor fins in accordance with some exemplary embodiments.

Referring to FIG. 1A, a test scheme for measuring the carrier concentration in semiconductor fins is provided. FIG. 1A illustrates a top view of test structure 10, which includes a plurality of semiconductor fins 12 therein. Test structure 10 may have a top-view shape of rectangle, for example, although other shapes may also be used. In some exemplary embodiments, length L1 and width W1 of test structure 10 are between about 40 μm and about 60 μm, for example. It is appreciated, however, that the values recited throughout the description are merely examples, and may be changed to different values.

Test structure 10 includes a plurality of semiconductor fins 12. In some embodiments, semiconductor fins 12 have width W2 equal to each other, and pitches P equal to each other. FIG. 1C illustrates a cross-sectional view of the structure in FIG. 1A, wherein the cross-sectional view is obtained from the plane crossing line 1C-1C in FIG. 1A. Throughout the description, the portions of semiconductor strips that are between and over neighboring isolation regions 16 are referred to as semiconductor fins 12, although at the time carrier concentrations are measured, entireties or majorities of semiconductor fins 12 may still be embedded in isolation regions 16. Semiconductor fins 12 are configured to be used for forming Fin Field-Effect Transistors (FinFETs, not shown). In subsequent formation of the FinFETs, the top surfaces of isolation regions 16 may be recessed, and some top portions of semiconductor fins 12 will be over the resulting top surfaces of isolation regions 16. Gate dielectrics and gate electrodes (not shown) are then formed on the sidewalls and top surfaces of the top portions of semiconductor fins 12.

Referring back to FIG. 1B, probe head 14, which includes probe pins PP1, PP2, PP3, and PP4 (also illustrated in FIG. 1A), is used to probe semiconductor fins 12. Probe head 14 is a four-point probe head configured to perform four-point probes. Probe pins PP1, PP2, PP3, and PP4 may be used to probe one or a plurality of semiconductor fins 12 at a same time. Furthermore, probe pins PP1, PP2, PP3, and PP4 are aligned to a straight line, so that they are in physical contact with the same ones of semiconductor fins 12. As shown in FIG. 1A, the top-view sizes of test structure 10 is larger than the top view area covered by probe pins PP1, PP2, PP3, and PP4, and the extra area of test structure 10 is used to provide an extra process window for probe pins PP1, PP2, PP3, and PP4. With the extra process window, even if probe pins PP1, PP2, PP3, and PP4 deviate from the desirable position, probe pins PP1, PP2, PP3, and PP4 can still land in test structure 10.

Referring to FIG. 1A, in the four-point probe, current I is applied to probe pins PP1 and PP4, and a voltage V is measured from probe pins PP2 and PP3. Resistance R1 of the portions of the probed semiconductor fins 12, which portions are between pins PP2 and PP3, is thus calculated as:

$$R1 = V/I \quad \text{[Eq. 1]}$$

By using the four-point probe method, the adverse effect of the contact resistance between probe pins PP1, PP2, PP3, and PP4 and the respective semiconductor fins 12 is substantially eliminated from the measured resistance R1.

Referring to FIG. 1C, each of semiconductor fins 12 may include lower portion 12B, and upper portion 12A over and contacting lower portion 12B. In some embodiments, portions 12A and portions 12B are formed of different materials, and portions 12A have much smaller resistivity than portions 12B. For example, portions 12A may comprise silicon germanium, or may be formed of substantially pure germanium, and portions 12B may comprise silicon with substantially no germanium, wherein both portions 12A and 12B are not doped with p-type and n-type impurities. Alternatively, portions 12A are doped with impurities (p-type or n-type) to a concentration much higher than the impurity concentration of portions 12B. In these embodiments, portions 12A and 12B may be formed of the same material or different materials. For example, portions 12A may be doped to an impurity concentration between about $10^{19}/cm^3$ and about $10^{21}/cm^3$, and portions 12B may be doped to an impurity concentration between about $10^{14}/cm^3$ and about $10^{17}/cm^3$. Current I mainly flows through portions 12A of semiconductor fins 12 since portions 12A have much higher carrier concentration (and much lower resistivity) than the underlying portions 12B of semiconductor fins 12.

Current I flows through the one(s) of semiconductor fins 12 that are in contact with probe pins PP1, PP2, PP3, and PP4. This is equivalent to inject current I into a fin that has a width equal to the total width of all the semiconductor fins 12 that are in contact with probe pins PP1, PP2, PP3, and PP4. As shown in FIG. 1, the dimension (diameter or width, depending on the shape of probe pins PP1, PP2, PP3, and PP4) is DM. The pitch of semiconductor fins 12 is P. Accordingly, the total number of semiconductor fins in contact with probe pins PP1, PP2, PP3, and PP4 is equal to DM/P, and the total width of all fins 12 in which current I flows through is W2*(DM/P). Assuming all current flows through portions 12A of semiconductor fins 12, which have depths D1 (FIG. 1C), then the total cross-sectional area A for conducting current I is:

$$A=D1*W2*(DM/P) \qquad [Eq.\ 2]$$

In some embodiments, dimension DM is in the range between about 0.1 μm and about 5 μm, for example. There may be about 10 to about 100 semiconductor fins 12 contacting probe pins PP1, PP2, PP3, and PP4 at the same time, although the number of semiconductor fins 12 in contact with probe pins PP1, PP2, PP3, and PP4 may be in a different range.

Figure 1B:
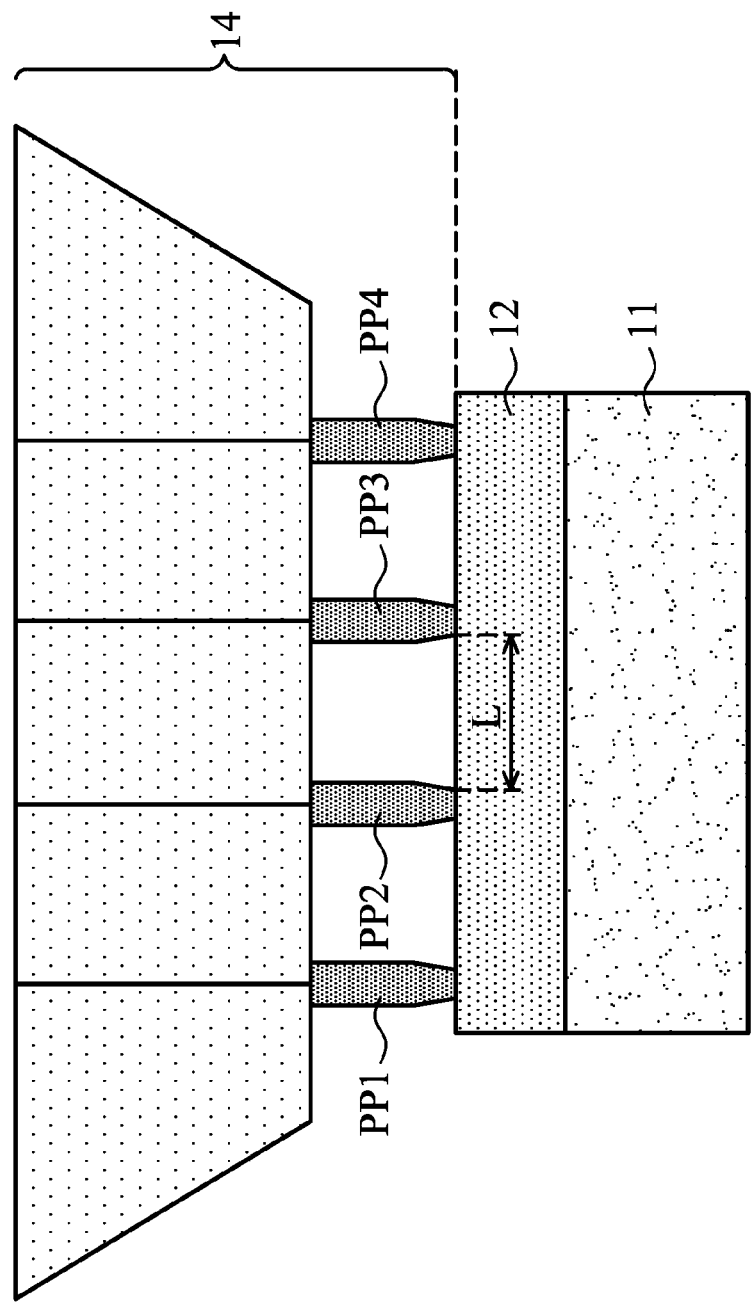
Figure 1C:
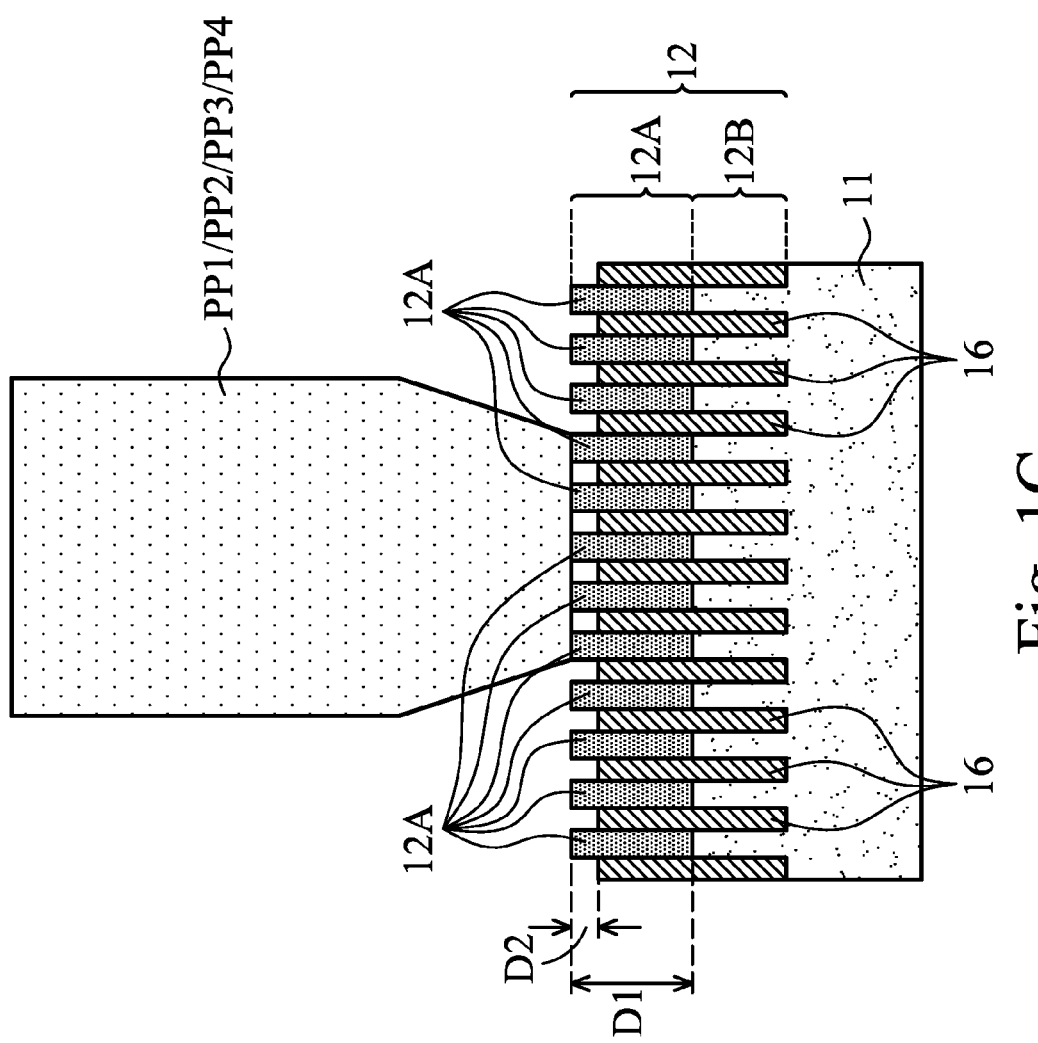
FIG. 1C illustrates a cross-sectional view of semiconductor fins, and a probe pin contacting the semiconductor fins for probing, wherein semiconductor fins protrude above the nearby Shallow Trench Isolation (STI) regions.

Resistivity ρ of portions 12A of semiconductor fins 12 may be calculated as:

$$\rho=R1*A/L \qquad [Eq.\ 3]$$

wherein L is the distance between probe pins PP2 and PP3, as shown in FIG. 1B. When resistivity ρ is calculated, carrier concentration may also be calculated since resistivity ρ and carrier concentration have the following relationship:

$$\rho=1/(e(\mu_h n_h+\mu_e n_e)) \qquad [Eq.\ 4]$$

wherein e is electron charge, $\mu_h$ is hole mobility, $n_h$ is hole concentration, $\mu_e$ is electron mobility, and $n_e$ is electron concentration. Hole mobility $\mu_h$ and electron mobility $\mu_e$ are known. In some embodiments, holes or electrons are dominant charges, and hence either $\mu_e n_e$ or $\mu_h n_h$ may be ignored, and equation 4 may be simplified. By using the methods in FIGS. 1A though 1C and equations 1 through 4, the carrier concentration of semiconductor fins 12 may be determined.

In FIG. 1C, isolation regions 16 are recessed slightly, wherein recessing depth D2 may be between about 1 nm and about 5 nm, for example. Due to distance D2, semiconductor fins 12 comprise portions over the top surfaces of isolation regions 16. The protruding of semiconductor fins 12, as shown in FIG. 1C, may be achieved by etching isolation regions 16 slightly to lower the top surfaces of isolation regions 16, wherein the etching of isolation regions 16 is performed after a Chemical Mechanical Polish (CMP) for leveling the top surfaces of semiconductor fins 12 and isolation regions 16. With protruding semiconductor fins 12, the contact of probe pins PP1, PP2, PP3, and PP4 to semiconductor fins 12 is improved. It is realized that recessing depth D2 is not high enough for forming FinFETs. In order to form FinFETs from semiconductor fins 12, further recessing of isolation regions 16 needs to be performed after the measurement of the carrier concentration.

Figure 2:
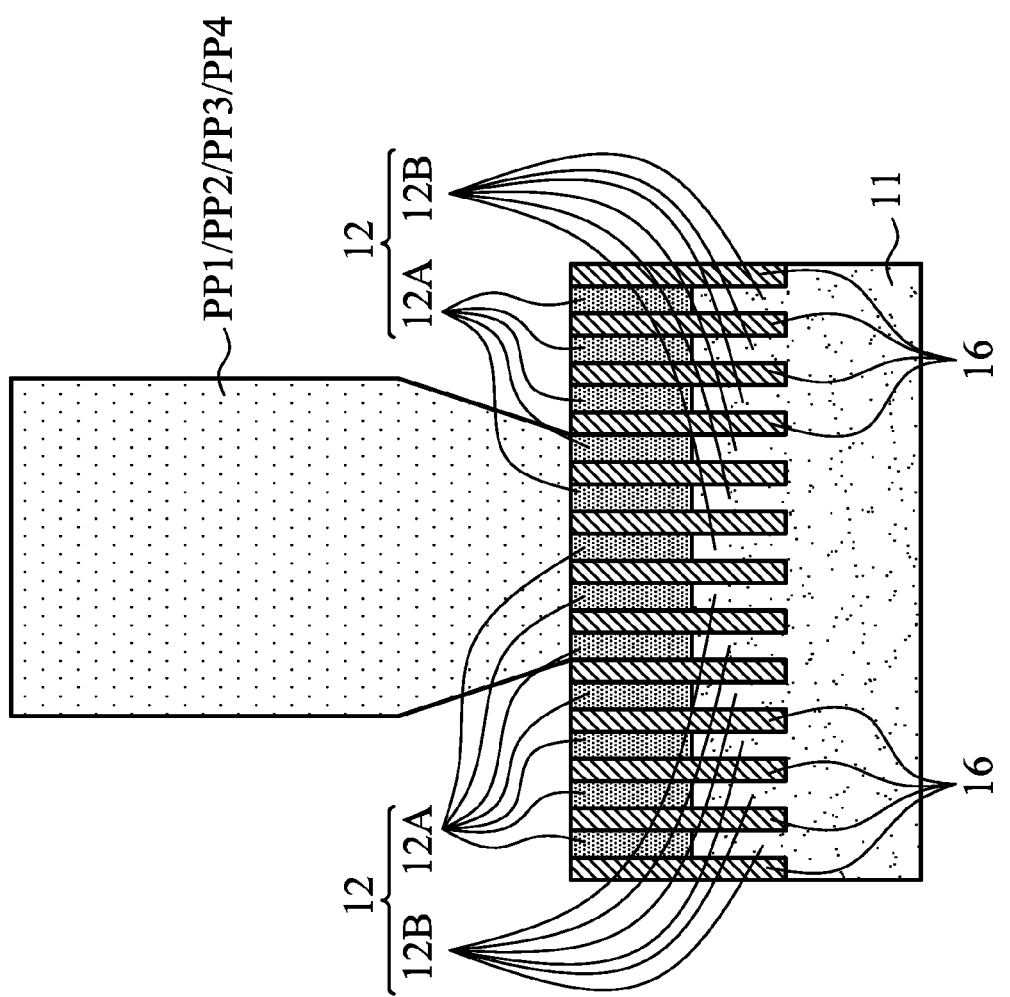
FIG. 2 illustrates a cross-sectional view of semiconductor fins, and a probe pin contacting the semiconductor fins for probing, wherein top surfaces of semiconductor fins are level with top surfaces of Shallow Trench Isolation (STI) regions.

FIG. 2 illustrates the cross-sectional view of a test scheme for determining carrier concentration of semiconductor fins 12 in accordance with alternative embodiments. This embodiment is similar to the embodiment in FIG. 1C, except that the top surfaces of semiconductor fins 12 are level with the top surface of isolation regions 16. Semiconductor fins 12 and isolation regions 16 as in FIG. 2 may be obtained by performing a CMP to level the top surfaces of semiconductor fins 12 and isolation regions 16. It is appreciated that the structure in FIG. 1C may be obtained by further recessing isolation regions 16 in FIG. 2. Experiment results indicate that the configuration of the test structure in FIGS. 1C and 2 may affect the measurement results, and measured R1 obtained using the test structure in FIG. 2 is sometimes lower than the measured R1 obtained using the test structure in FIG. 1C. In the situation that the difference in the measurement results does occur, the structure in FIG. 1C, rather than the structure in FIG. 2, is used in accordance with embodiments.

The performance of the FinFET is related to the carrier concentration in the fins. Conventionally, the carrier concentration may be measured by using an un-patterned wafer, and measuring from the un-patterned wafer, wherein the un-patterned wafer includes a blanket layer formed of same material as portions 12B (FIG. 1C) and a blanket layer formed of same material as portions 12A. Experiment results indicated that, however, the measured hole concentration obtained from the un-patterned wafer is lower than the hole concentration obtained using the methods in accordance with embodiments (FIGS. 1A through 1C, for example). The respective difference was as much as about 1.5 orders (more than ten times). Accordingly, the carrier concentration of semiconductor fins cannot be obtained by measuring large bulk patterns. Rather, to obtain accurate carrier concentrations, measurements are performed on the semiconductor fins that have already been patterned, as shown in FIGS. 1A, 1B, and 1C, for example.

Figure 3:
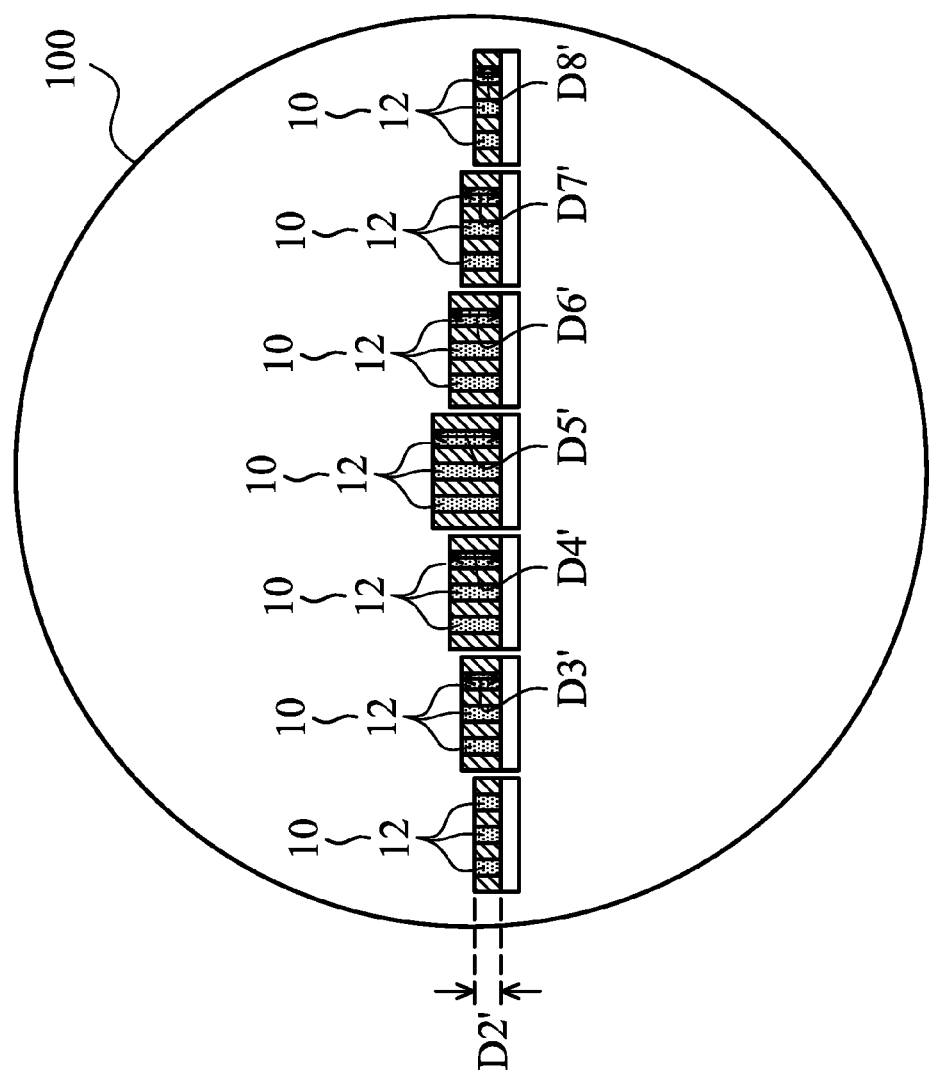
FIG. 3 schematically illustrates the depth differences of semiconductor strips after a chemical mechanical polish is performed on a wafer.
Figure 4:
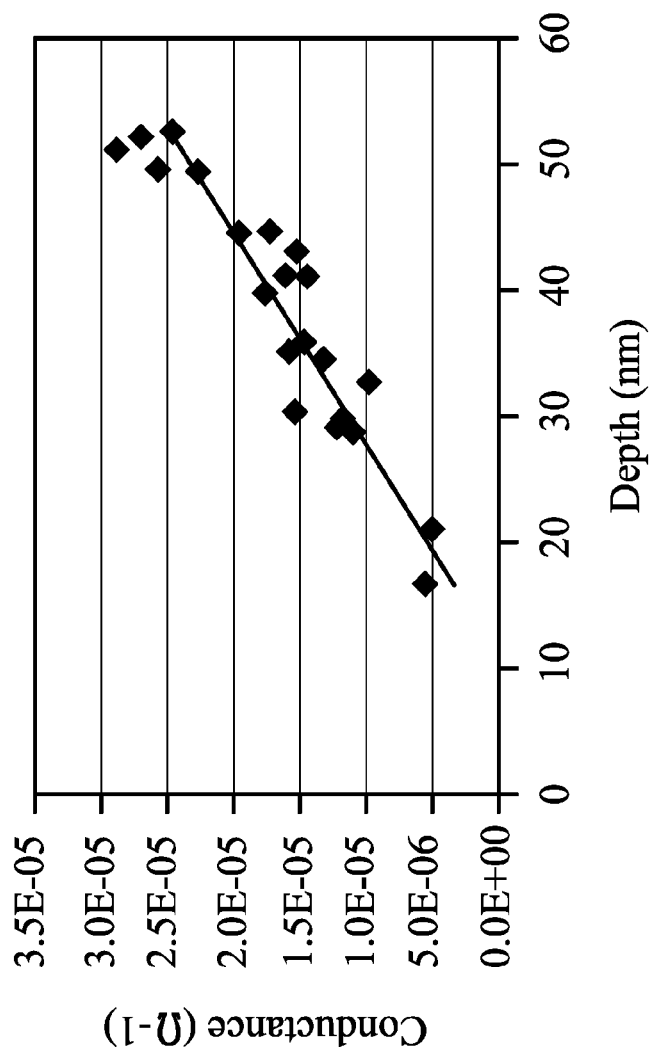
FIG. 4 illustrates the conductance of semiconductor fins as a function of depths of semiconductor fins.

In accordance with embodiments, as described above, the determination of the carrier concentration is achieved by measuring resistance R1, calculating resistivity ρ from resistance R1, and calculating carrier concentrations from resistivity ρ. This method is made feasible (without sacrificing the accuracy of the results) since resistivity ρ remains relative constant regardless of the value of depth D1 (FIG. 1C), wherein depth D1 is difficult to control in the manufacture of integrated circuits. For example, FIG. 3 schematically illustrates the change of depth D1 of semiconductor fins 12 as a function of positions of the sample test structures 10 in wafer 100, in which semiconductor fins 12 are formed. After CMP, the depths D2' through D8') of different semiconductor fins 12 are related to the positions of the respective semiconductor fins 12 on wafer 100. Accordingly, if resistivity ρ changes with depth D1, then measured resistances R1 would have changed with the position, and hence the determined carrier concentrations would have changed depending on the positions of test structures 10 on wafer 100. FIG. 4, however, indicates that resistivity ρ does not change with depth D1, and hence it is feasible to obtain accurate carrier concentrations using the methods in FIGS. 1A-1C and Equations 1 through 4.

Referring to FIG. 4, the conductance (1/R1) of measured semiconductor fins 12 is illustrated as a function of depth (D1 of semiconductor fins 12 in FIG. 1C). To obtain the data in FIG. 4, three CMP steps are performed on wafer 100 (FIG. 3), which includes a plurality of semiconductor fins 12 in different locations of wafer 100. After each of the CMP step, a measurement is performed. The average fin depths after the three CMP steps were 49 nm, 44 nm, and 35 nm. Since 49 nm, 44 nm, and 35 nm were average fin depths, and the actual fin depths of the plurality of fins scattered on wafer 100 were different from each other, multiple fin depths may be obtained after each of the three CMP steps. The calculated conductive 1/R1 and the respective depth D1 are plotted in FIG. 4. FIG. 4 illustrates that conductance 1/R increases linearly with the increase in depth D1. According to Equation 3, conductance 1/R1 may be expressed as (according to equation 2):

$$1/R1 = A/(\rho \cdot L) \quad [\text{Eq. 5}]$$

The linear increase of (1/R) with the increase of D1 indicates that resistivity ρ remains constant for the plurality of sample points in FIG. 3, which sample points involve depth D1 from about 15 μm to about 50 μm. Since resistivity ρ is constant, the calculated carrier concentration is accurate regardless of from which location of wafer 100 the sample test structure 10 for calculating the carrier concentration are obtained.

Figure 5:
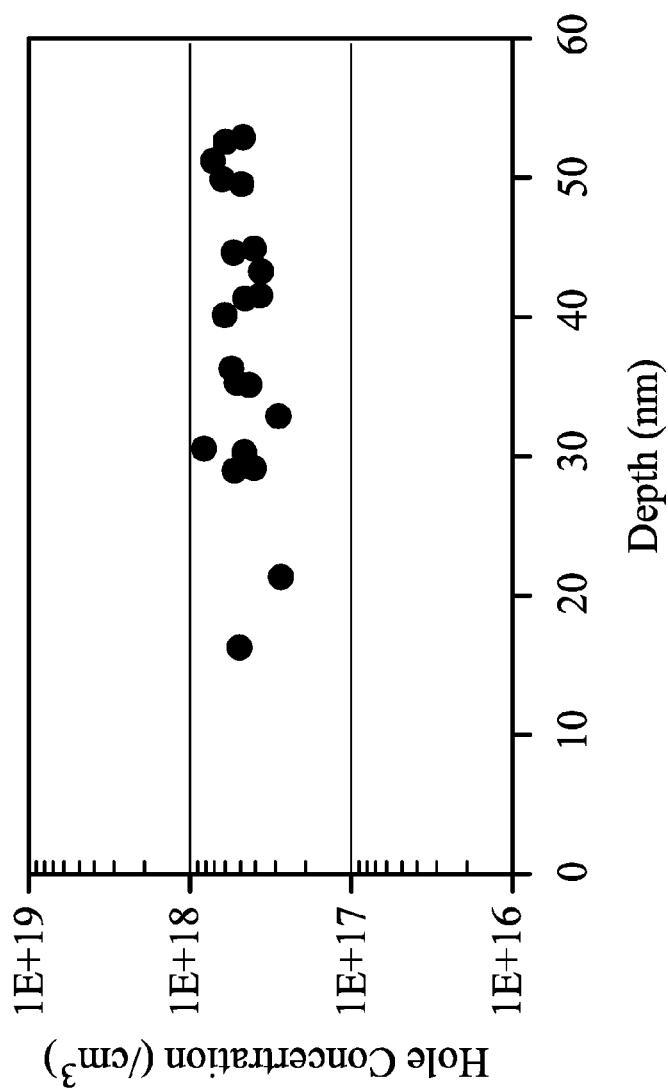
FIG. 5 illustrates the result of the determined hole concentrations in accordance with exemplary embodiments, wherein hole concentrations are shown as a function of depths of semiconductor strips.

FIG. 5 illustrates the exemplary calculated hole concentrations of semiconductor fins 12 as a function of depth (D1 in FIG. 1C) of semiconductor fin portions 12A. The results in FIGS. 4 and 5 are obtained from sample test structures 10 that include Ge as portions 12A and silicon as portions 12B, with no additional p-type and n-type doping in portions 12A and 12B. The results also indicate that the measured carrier concentration remains substantially constant when the depths of the measured sample fins change, which change may be caused by process variations or the change in the positions of test structures 10 on wafer 100 (FIG. 3).

In accordance with embodiments, a method includes probing at least one semiconductor fin using a four-point probe head, with four probe pins of the four-point probe head contacting the at least one semiconductor fin. A resistance of the at least one semiconductor fin is calculated. A carrier concentration of the semiconductor fin is calculated from the resistance.

In accordance with other embodiments, a method includes contacting a first, a second, a third, and a fourth probe pin of a four-point probe head with a plurality of semiconductor fins in a test structure to probe the test structure. The plurality of semiconductor fins is parallel to each other. A current is applied to flow through the first probe pin and the fourth probe pin. A voltage is measured from the second probe pin and the third probe pin, wherein the second and the third probe pins are between the first probe pin and the fourth probe pin. A resistivity of the plurality of semiconductor fins is calculated using the current and the voltage. A carrier concentration of the semiconductor fin is calculated from the resistivity.

In accordance with yet other embodiments, a method includes forming a plurality of semiconductor fins between a plurality of isolation regions, performing a chemical mechanical polish to level top surfaces of the semiconductor fins with top surfaces of the plurality of isolation regions, and recessing top surfaces of the a plurality of isolation regions. The plurality of semiconductor fins comprises portions over the plurality of isolation regions. The plurality of semiconductor fins is then probed using a four-point probe head.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a plurality of semiconductor fins between a plurality of isolation regions;
   performing a chemical mechanical polish to level top surfaces of the semiconductor fins with top surfaces of the plurality of isolation regions;
   recessing top surfaces of the plurality of isolation regions, wherein the plurality of semiconductor fins comprises portions higher than the plurality of isolation regions; and
   probing the plurality of semiconductor fins using a four-point probe head.

2. The method of claim 1 further comprising:
   calculating a resistivity of the plurality of semiconductor fins using a resistance measured during the probing; and
   calculating a carrier concentration of the semiconductor fins from the resistivity.

3. The method of claim 1, wherein the plurality of semiconductor fins comprises germanium fins over silicon fins, and wherein in the probing the plurality of semiconductor fins, probe pins of the four-point probe head are put to contact with the germanium fins.

4. The method of claim 1, wherein the plurality of semiconductor fins has equal widths and equal pitches.

5. The method of claim 1, wherein the plurality of semiconductor fins is comprised in a test structure having a top-view size between about 40 μm and about 60 μm, and wherein probe pins in the four-point probe head have top-view sizes between about 0.1 μm and about 5 μm.

6. The method of claim 1 further comprising, after the probing, further recessing the plurality of isolation regions.

7. The method of claim 1 further comprising performing a planarization on the plurality of semiconductor fins before the probing.

8. A method comprising:
   forming semiconductor fins on a semiconductor wafer; and
   performing a plurality of probing steps on the semiconductor wafer, with each of the plurality of probing steps comprising:
   measuring a resistance of at least one semiconductor fin; and
   determining a carrier concentration of the at least one semiconductor fin based on the resistance.

9. The method of claim 8 further comprising determining a resistivity of the at least one semiconductor fin from the resistance, wherein the carrier concentration is calculated from the resistivity.

10. The method of claim 8, wherein the measuring the resistance is performed using a four-point probe head comprising four probe pins, and during the measuring the resistance, the four probe pins of the four-point probe head are in contact with the at least one semiconductor fin.

11. The method of claim 10, wherein the at least one semiconductor fin comprises a plurality of semiconductor fins, and during the measuring, each of the four probe pins is in contact with each of the plurality of semiconductor fins.

12. The method of claim 8 further comprising, after the semiconductor fins are formed and before the resistance is measured, performing a first recessing on isolation regions between the semiconductor fins.

13. The method of claim 12 further comprising, after the resistance is measured, performing a second recessing on isolation regions.

14. The method of claim 8, wherein the plurality of probing steps is performed on semiconductor fins at different locations of the semiconductor wafer, with the semiconductor fins at the different locations having different heights.

15. The method of claim 8 further comprising, before the plurality of probing steps is performed, performing a planarization to level top surfaces of the semiconductor fins.

16. A method comprising:
forming a plurality of semiconductor fins;
leveling top surfaces of the plurality of semiconductor fins with top surfaces of isolation regions between the plurality of semiconductor fins;
putting each of a first, a second, a third, and a fourth probe pin of a four-point probe head with each of the plurality of semiconductor fins, wherein the plurality of semiconductor fins is parallel to each other;
applying a current to flow through the first probe pin and the fourth probe pin;
measuring a voltage from the second probe pin and the third probe pin, wherein the second and the third probe pins are between the first probe pin and the fourth probe pin; and
determining a carrier concentration of the plurality of semiconductor fins based on the voltage and the current.

17. The method of claim 16, wherein the determining the carrier concentration comprises:
calculating a resistivity of the plurality of semiconductor fins using the current and the voltage; and
calculating a carrier concentration of the plurality of semiconductor fins from the resistivity.

18. The method of claim 16 further comprising, after the plurality of semiconductor fins is formed and before the measuring the voltage, performing a first recessing on the isolation regions.

19. The method of claim 18 further comprising, after the voltage is measured, performing a second recessing on the isolation regions.

20. The method of claim 16, wherein the forming the plurality of semiconductor fins comprises forming silicon germanium fins.

* * * * *